(12) United States Patent
Chen et al.

(10) Patent No.: US 11,145,733 B1
(45) Date of Patent: Oct. 12, 2021

(54) METHOD OF MANUFACTURING A SEMICONDUCTOR DEVICE

(71) Applicant: UNITED MICROELECTRONICS CORP., Hsin-Chu (TW)

(72) Inventors: Chin-Hung Chen, Tainan (TW); Chih-Kai Hsu, Tainan (TW); Ssu-I Fu, Kaohsiung (TW); Chia-Jung Hsu, Tainan (TW); Chun-Ya Chiu, Tainan (TW); Yu-Hsiang Lin, New Taipei (TW); Po-Wen Su, Kaohsiung (TW); Chung-Fu Chang, Tainan (TW); Guang-Yu Lo, New Taipei (TW); Chun-Tsen Lu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/033,919

(22) Filed: Sep. 27, 2020

(51) Int. Cl.
| | |
|---|---|
| *H01L 29/423* | (2006.01) |
| *H01L 29/40* | (2006.01) |
| *H01L 21/308* | (2006.01) |
| *H01L 29/51* | (2006.01) |
| *H01L 29/66* | (2006.01) |
| *H01L 21/311* | (2006.01) |
| *H01L 21/28* | (2006.01) |
| *H01L 29/78* | (2006.01) |

(52) U.S. Cl.
CPC .... *H01L 29/42368* (2013.01); *H01L 21/3086* (2013.01); *H01L 29/401* (2013.01); *H01L 21/28211* (2013.01); *H01L 21/31111* (2013.01); *H01L 29/511* (2013.01); *H01L 29/66674* (2013.01); *H01L 29/7801* (2013.01)

(58) Field of Classification Search
None
See application file for complete search history.

(56) References Cited

U.S. PATENT DOCUMENTS

| | | |
|---|---|---|
| 5,868,870 A | 2/1999 | Fazan |
| 2014/0302662 A1* | 10/2014 | Ma .................... H01L 21/76224 438/424 |

* cited by examiner

*Primary Examiner* — Hsien Ming Lee
(74) *Attorney, Agent, or Firm* — Winston Hsu

(57) ABSTRACT

The present invention discloses a method for forming a semiconductor device with a reduced silicon horn structure. After a pad nitride layer is removed from a substrate, a hard mask layer is conformally deposited over the substrate. The hard mask layer is then etched and trimmed to completely remove a portion of the hard mask layer from an active area and a portion of the hard mask layer from an oblique sidewall of a protruding portion of a trench isolation region around the active area. The active area is then etched to form a recessed region. A gate dielectric layer is formed in the recessed region and a gate electrode layer is formed on the gate dielectric layer.

19 Claims, 8 Drawing Sheets

METHOD OF MANUFACTURING A SEMICONDUCTOR DEVICE

BACKGROUND OF THE INVENTION

1. Field of the Invention

The present invention relates to the field of semiconductor technology, and in particular to an improved method of manufacturing a semiconductor transistor device with reduced silicon horn structure.

2. Description of the Prior Art

High-voltage metal-oxide-semiconductor (HVMOS) devices are widely used for many types of high-voltage circuits such as input/output circuits, CPU power supply circuits, power management systems, AC/DC converters, etc. The commonly seen HVMOS devices include lateral-diffused metal-oxide-semiconductor (LDMOS) devices, field-oxide drift MOS (FDMOS) devices, and double-diffused drain MOS (DDDMOS) devices.

As known in the art, negative-bias temperature instability (NBTI) of HVMOS devices may cause reliability problems. The NBTI may be worsened if a silicon horn structure is present under the gate electrode of the HVMOS device around the trench isolation region. Therefore, there is constant need in this industry to provide an improved method of manufacturing a semiconductor MOS device that is capable of avoiding the undesirable silicon horn structure.

SUMMARY OF THE INVENTION

One object of the present invention is to provide an improved method of manufacturing a semiconductor device with reduced silicon horn structure to solve the above-mentioned shortcomings and shortcomings of the prior art.

One aspect of the invention provides a method for fabricating a semiconductor device. A substrate having an active area and a trench isolation region surrounding the active area is provided. The trench isolation region protrudes from a top surface of the active area and forms a step height at an interface between the active area and the trench isolation region. A hard mask layer is deposited on the substrate.

The hard mask layer comprises a first portion on the active area, a second portion on the trench isolation region, and a third portion at the interface between the active area and the trench isolation region. The third portion extends between the first portion and the second portion. A patterned resist layer is formed on the hard mask layer. The patterned resist layer has an opening exposing the third portion and the first portion of the hard mask layer on the active area, and partially exposing the second portion of the hard mask layer on the trench isolation region.

An isotropic etching process is performed to remove the exposed first portion, the second portion and the third portion of the hard mask layer from the opening, thereby revealing the active area. The active area is anisotropically etched through the opening to form a recessed region and a horn structure at the interface between the active area and the trench isolation region. The horn structure may be laterally etched, thereby forming a reduced horn structure.

According to some embodiments, after laterally etching the horn structure, an oxidation process is performed to oxidize the reduced horn structure and a top surface of the substrate within the recessed region, thereby forming a first oxide layer. A second oxide layer is then deposited on the first oxide layer.

According to some embodiments, the oxidation process is an in-situ steam growth (ISSG) process.

According to some embodiments, the first oxide layer is a silicon dioxide layer.

According to some embodiments, the second oxide layer is a silicon dioxide layer.

According to some embodiments, after depositing the second oxide layer on the first oxide layer, the hard mask layer is removed.

According to some embodiments, the substrate comprises a silicon substrate and the recessed region is a recessed silicon region.

According to some embodiments, the hard mask layer comprises a silicon nitride layer.

According to some embodiments, the horn structure is a silicon horn structure.

Another aspect of the invention provides a method for fabricating a semiconductor device. A substrate having an active area and a trench isolation region surrounding the active area is provided. The trench isolation region protrudes from a top surface of the active area and forms a step height at an interface between the active area and the trench isolation region.

A first lithographic process is performed to form a first patterned resist layer on the substrate. The first patterned resist layer has a first opening exposing the active area and partially exposing the trench isolation region. The exposed trench isolation region is etched through the first opening. The first patterned resist layer is removed. A hard mask layer is deposited on the substrate.

The hard mask layer comprises a first portion on the active area, a second portion on the trench isolation region, and a third portion at the interface between the active area and the trench isolation region. The third portion extends between the first portion and the second portion.

A second lithographic process is performed to form a second patterned resist layer on the hard mask layer. The second patterned resist layer has a second opening exposing the third portion and the first portion of the hard mask layer on the active area, and partially exposing the second portion of the hard mask layer on the trench isolation region. An isotropic etching process is performed to remove the exposed first portion, the second portion and the third portion of the hard mask layer from the second opening, thereby revealing the active area.

According to some embodiments, after performing the isotropic etching process to remove the exposed first portion, the second portion and the third portion of the hard mask layer from the second opening, the active area is anisotropically etched through the second opening to form a recessed region and a horn structure at the interface between the active area and the trench isolation region. The horn structure may be laterally etched, thereby forming a reduced horn structure.

According to some embodiments, after removing the second patterned resist layer from the hard mask layer, an oxidation process is performed to oxidize the reduced horn structure and a top surface of the substrate within the recessed region, thereby forming a first oxide layer. A second oxide layer is then deposited on the first oxide layer.

According to some embodiments, the oxidation process is an in-situ steam growth (ISSG) process.

According to some embodiments, the first oxide layer is a silicon dioxide layer.

According to some embodiments, the second oxide layer is a silicon dioxide layer.

According to some embodiments, after depositing the second oxide layer on the first oxide layer, the hard mask layer is removed.

According to some embodiments, the substrate comprises a silicon substrate and the recessed region is a recessed silicon region.

According to some embodiments, the hard mask layer comprises a silicon nitride layer.

According to some embodiments, the horn structure is a silicon horn structure.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
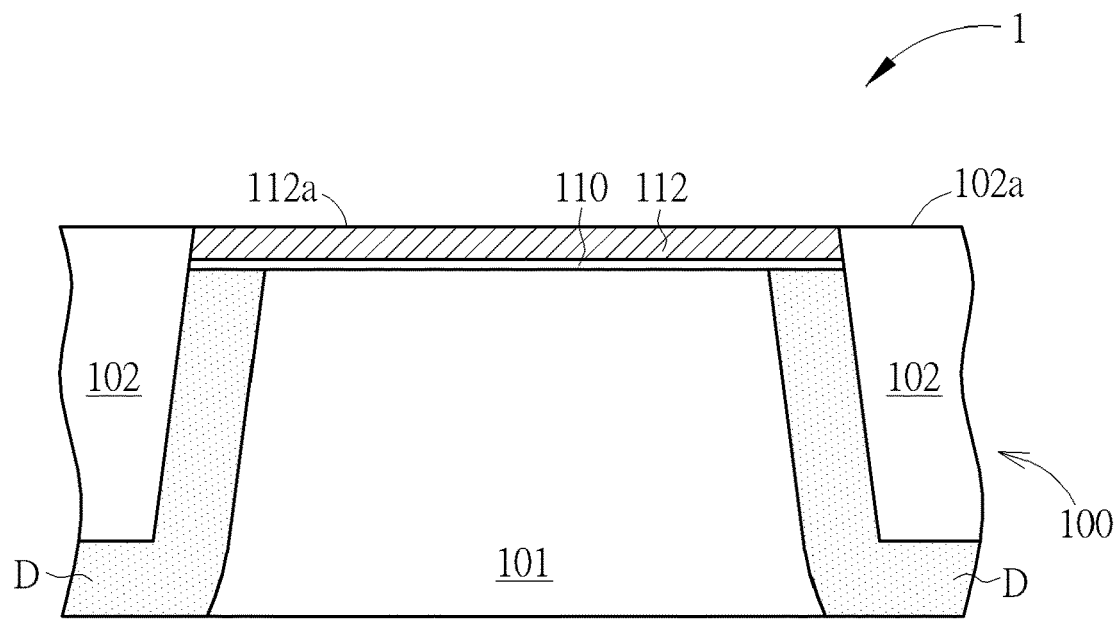
FIG. 1 to FIG. 7 are schematic cross-sectional diagrams showing an exemplary method for manufacturing a semiconductor device in accordance with one embodiment of the invention.

Please refer to FIG. 1 to FIG. 7. FIG. 1 to FIG. 7 are schematic cross-sectional diagrams showing an exemplary method for manufacturing a semiconductor device 1 in accordance with one embodiment of the invention. As shown in FIG. 1, a substrate 100 such as a silicon substrate is provided. The substrate 100 comprises an active area 101 and a trench isolation region 102 surrounding the active area 101. According to an embodiment, a pad oxide layer 110 such as a silicon dioxide layer may be formed on the active area 101. According to an embodiment, a pad nitride layer 112 such as a silicon nitride layer may be formed on the pad oxide layer 110. The trench isolation region 102 may comprise a silicon oxide layer, but is not limited thereto. The top surface 102a of the trench isolation region 102 may be coplanar with the top surface 112a of the pad nitride layer 112.

According to an embodiment, the semiconductor device 1 may be a high-voltage MOS transistor device or a field-oxide drift MOS (FDMOS) device, but is not limited thereto. According to an embodiment, the semiconductor device 1 may further comprise a drift region D surrounding the trench isolation region 102. According to an embodiment, the drift region D may be a diffusion region such as an N-type region and may partially overlap with the active area 101.

Figure 2:
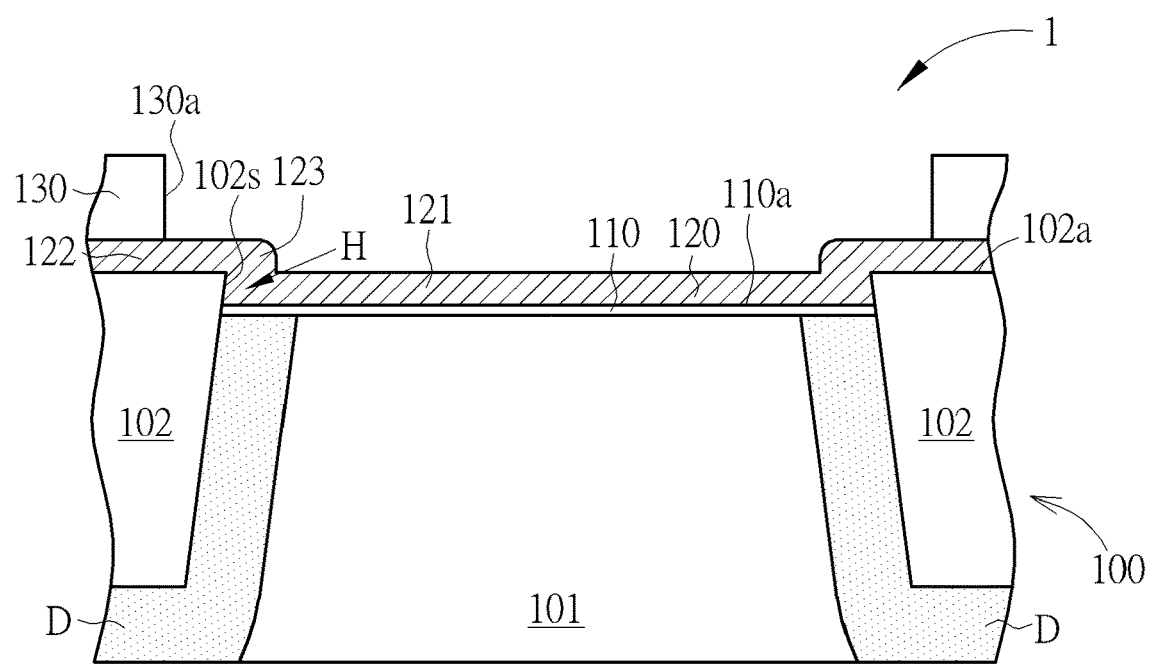

As shown in FIG. 2, the pad nitride layer 112 is removed by using methods known in the art, for example, a wet etching process or a dry etching process. After the removal of the pad nitride layer 112, the trench isolation region 102 protrudes from a top surface 110a of the pad oxide layer 110 and forms a step height H at an interface between the active area 101 and the trench isolation region 102. A conformal hard mask layer 120 is then deposited on the substrate 100 in a blanket manner. According to an embodiment, the hard mask layer 120 may comprise a silicon nitride layer. According to an embodiment, the hard mask layer 120 may have a thickness of about 200 angstroms, but is not limited thereto.

According to an embodiment, the hard mask layer 120 may comprise a first portion 121 directly on the active area 101, a second portion 122 directly on the trench isolation region 102, and a third portion 123 at the interface between the active area 101 and the trench isolation region 102. The third portion 123 extends between the first portion 121 and the second portion 122 and covers the oblique sidewall 102s of the protruding portion of the trench isolation region 102.

Subsequently, a patterned resist layer 130 such as a photoresist pattern is then formed on the hard mask layer 120 by using methods known in the art, for example, a lithographic process including an exposure process and a development process. The patterned resist layer 130 comprises an opening 130a that exposes the first portion 121 on the active area 101 and the third portion 123 of the hard mask layer 120, and partially exposes the second portion 122 of the hard mask layer 120 on the trench isolation region 102.

Figure 3:
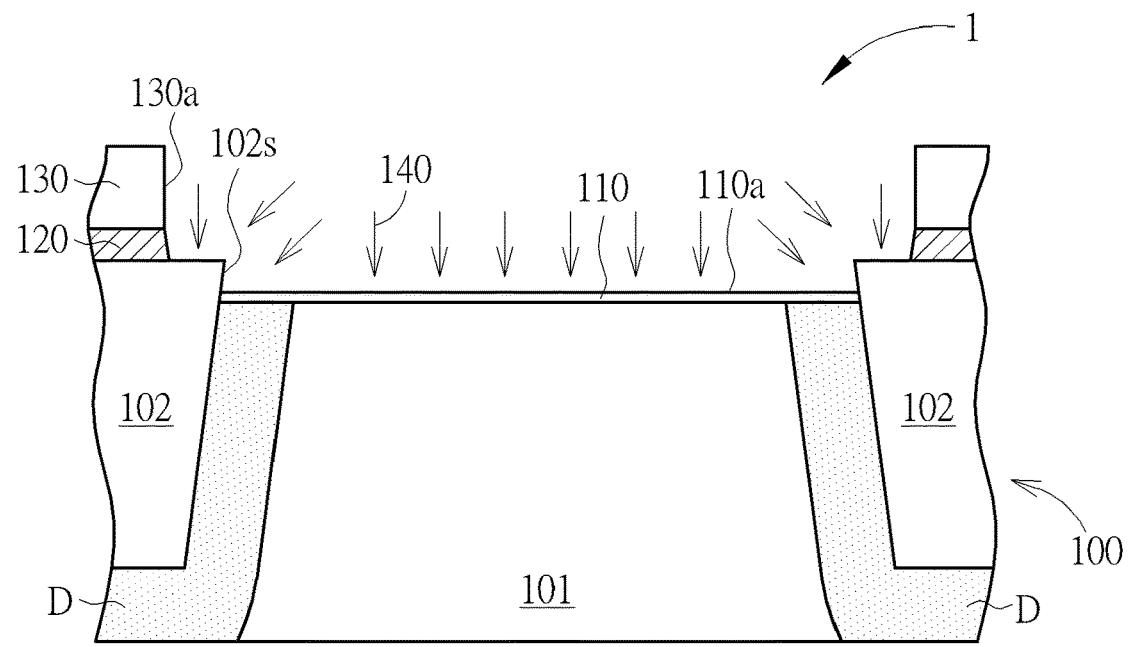

As shown in FIG. 3, an isotropic etching process (or SiN trimming process) 140 is then performed to selectively remove the exposed first portion 121, the second portion 122 and the third portion 123 of the hard mask layer 120 from the opening 130a, thereby revealing the top surface 110a of the pad oxide layer 110. According to an embodiment, the first portion 121 of the hard mask layer 120 can be completely removed from the top surface 110a of the pad oxide layer 110. According to an embodiment, the third portion 123 of the hard mask layer 120 can be completely removed from the oblique sidewall 102s of the protruding portion of the trench isolation region 102.

Figure 4:
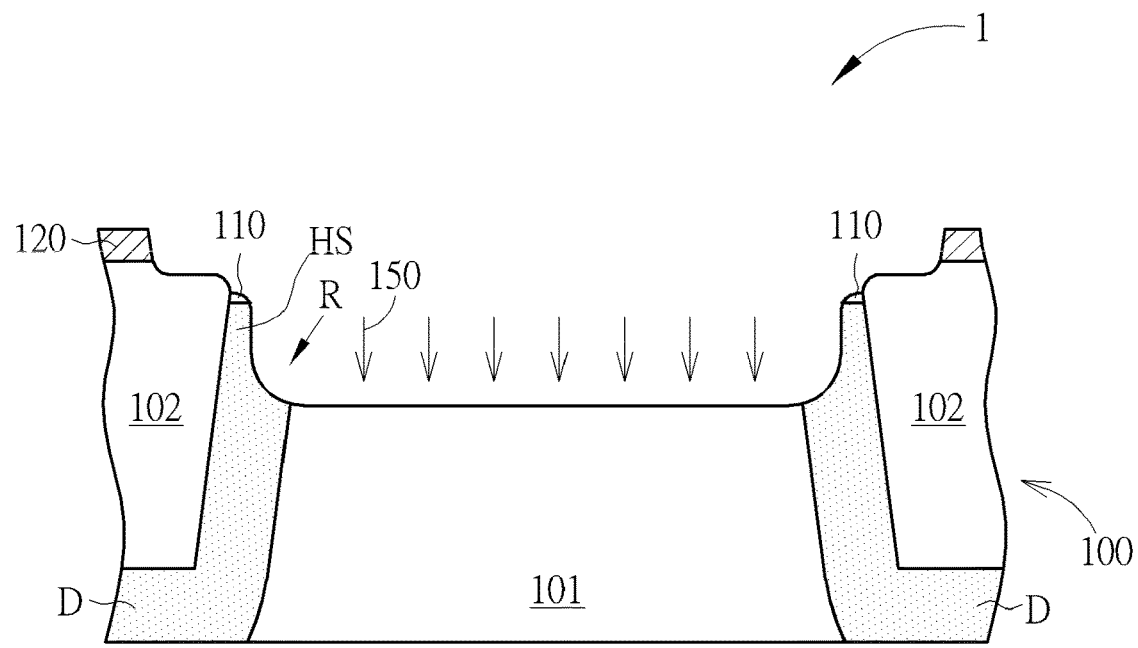

As shown in FIG. 4, an etching process 150 is then performed to anisotropically etch the active area 101 through the opening 130a to form a recessed region R and a horn structure HS at the interface between the active area 101 and the trench isolation region 102. According to an embodiment, the recessed region R is a recessed silicon region and the horn structure HS is a silicon horn structure. During the etching process 150, the patterned resist layer 130 may be completely consumed and the underlying hard mask layer 120 may act as an etching hard mask. According to an embodiment, a portion of the trench isolation region 102 not covered by the hard mask layer 120 may be etched away.

Figure 5:
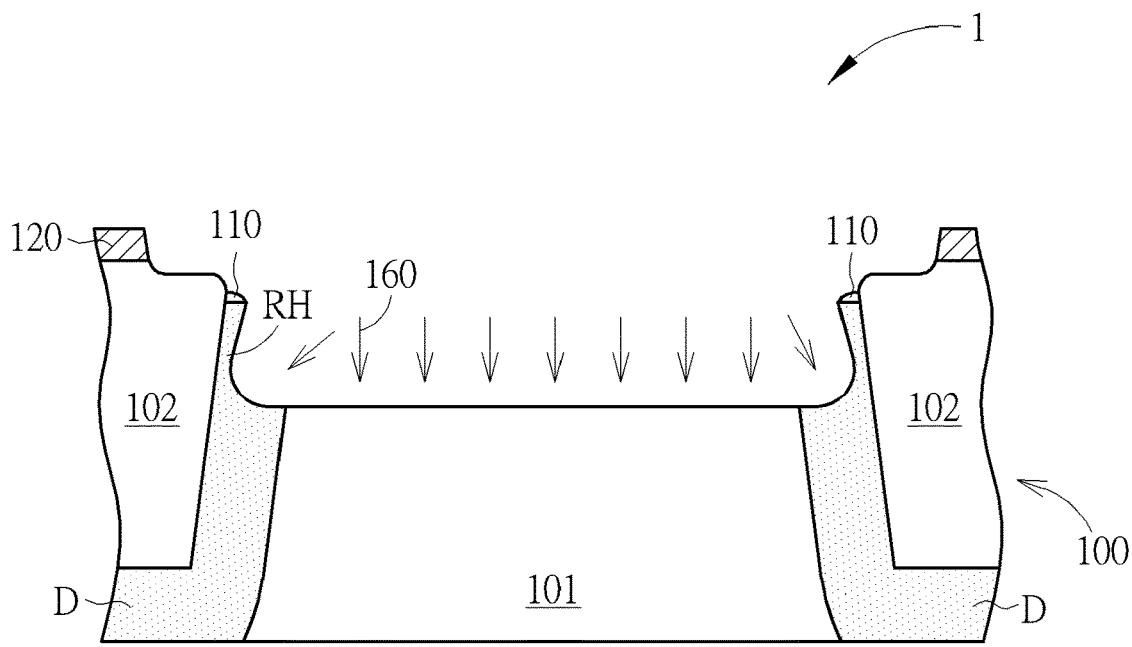

As shown in FIG. 5, according to an embodiment, after the etching process 150 is completed, a lateral etching process 160 may be performed to laterally etch the horn structure HS, thereby forming a reduced horn structure RH around the recess R. It is understood that the etching process 150 and the lateral etching process 160 may be performed in the same etching tool or chamber.

Figure 6:
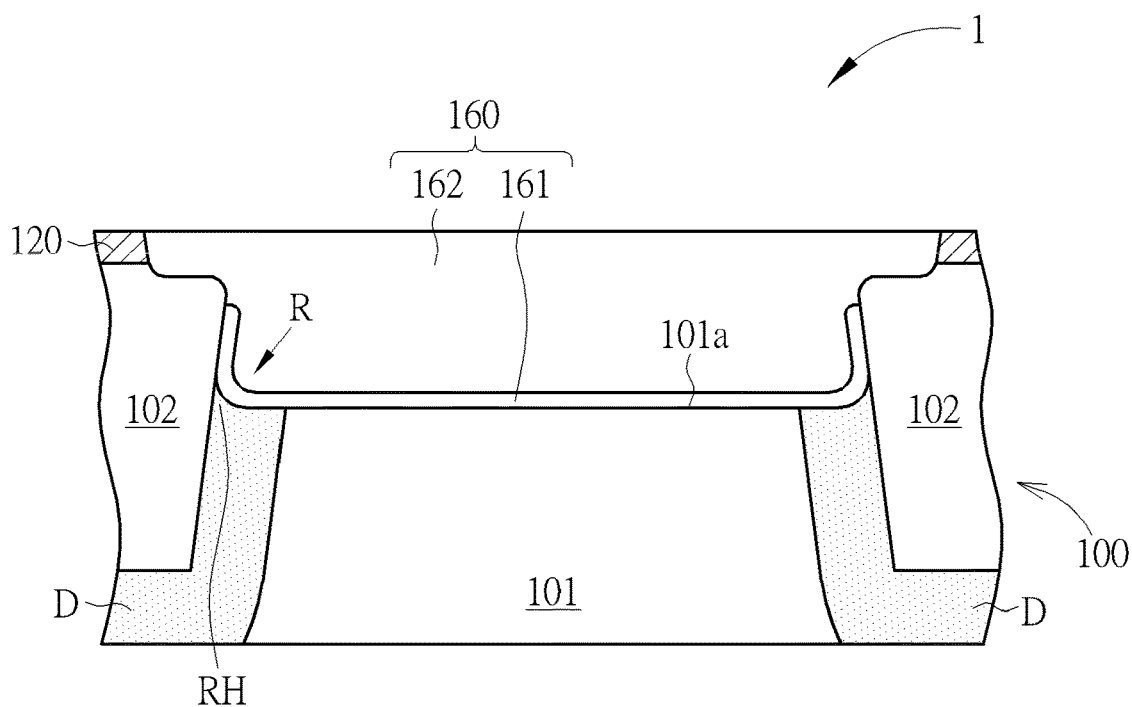

As shown in FIG. 6, a gate dielectric layer 160 is then formed in the recess R. According to an embodiment, for example, the gate dielectric layer 160 may comprises a first oxide layer 161 and a second oxide layer 162. According to an embodiment, for example, the first oxide layer 161 may be a silicon dioxide layer, which can be formed by using an oxidation process such as an in-situ steam generation (ISSG) process, but is not limited thereto. The reduced horn structure RH and a top surface 101a of the substrate 100 within the recessed region R are oxidized, thereby forming the first oxide layer 161. According to an embodiment, for example, the second oxide layer 162 may be a silicon dioxide layer, which can be formed by using a chemical vapor deposition (CVD) process, but is not limited thereto. According to an embodiment, the second oxide layer 162 may be deposited on the first oxide layer 161 and the hard mask layer 120 in a blanket manner, and then polished by using a chemical mechanical polishing (CMP) process using the hard mask layer 120 as a polish stop layer.

Figure 7:
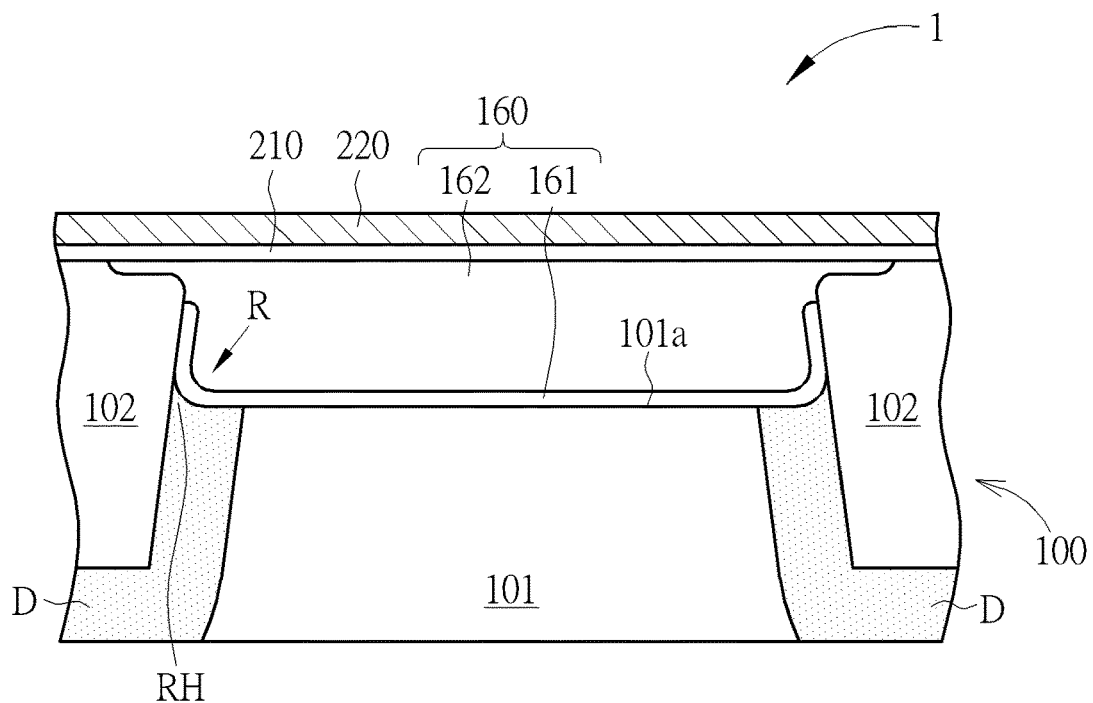

As shown in FIG. 7, after forming the gate dielectric layer 160 in the recess region R, the hard mask layer 120 may be removed. A high-k dielectric layer 210 is then deposited on the gate dielectric layer 160 and the trench isolation region 102. According to an embodiment, for example, the high-k dielectric layer 210 may comprise $HfO_2$, but is not limited thereto. Subsequently, a gate electrode layer 220 may be formed on the high-k dielectric layer 210. According to an embodiment, for example, the gate electrode layer 220 may comprise metals or polysilicon, but is not limited thereto.

Figure 8:
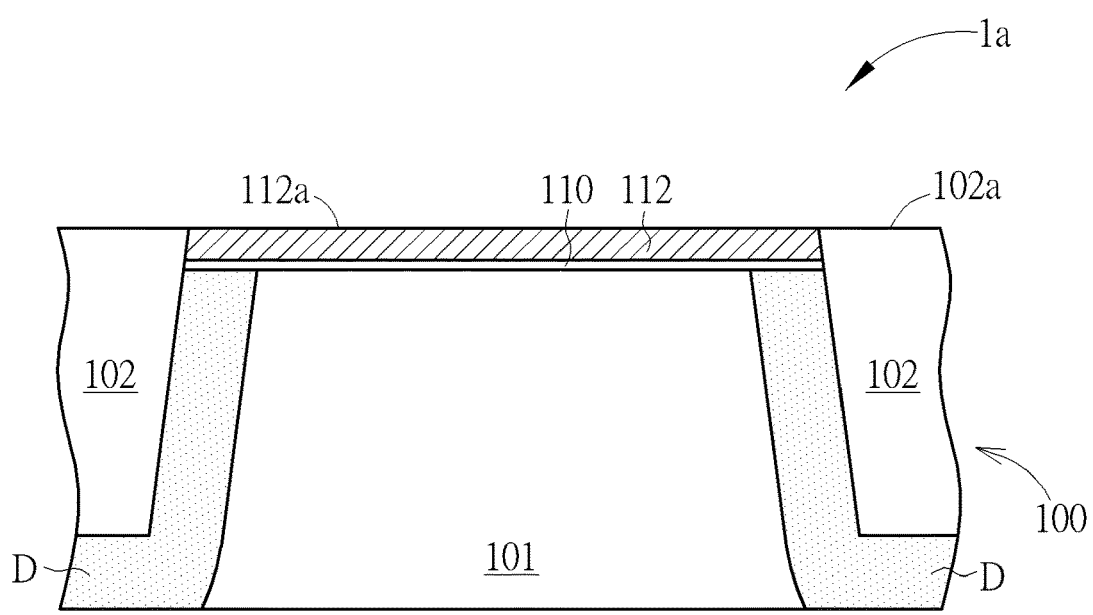
FIG. 8 to FIG. 16 are schematic cross-sectional diagrams showing an exemplary method for manufacturing a semiconductor device in accordance with another embodiment of the invention.

Please refer to FIG. 8 to FIG. 16. FIG. 8 to FIG. 16 are schematic cross-sectional diagrams showing an exemplary method for manufacturing a semiconductor device 1a in accordance with another embodiment of the invention, wherein like layers, regions or elements are designated by like numeral numbers or labels. As shown in FIG. 8, likewise, a substrate 100 such as a silicon substrate is provided. The substrate 100 comprises an active area 101 and a trench isolation region 102 surrounding the active area 101. According to an embodiment, a pad oxide layer 110 such as a silicon dioxide layer may be formed on the active area 101. According to an embodiment, a pad nitride layer 112 such as a silicon nitride layer may be formed on the pad oxide layer 110. The trench isolation region 102 may comprise a silicon oxide layer, but is not limited thereto. The top surface 102a of the trench isolation region 102 may be coplanar with the top surface 112a of the pad nitride layer 112.

According to an embodiment, the semiconductor device 1a may be a high-voltage MOS transistor device or FDMOS device, but is not limited thereto. According to an embodiment, the semiconductor device 1a may further comprise a drift region D surrounding the trench isolation region 102. According to an embodiment, the drift region D may be a diffusion region such as an N-type region and may partially overlap with the active area 101.

Figure 9:
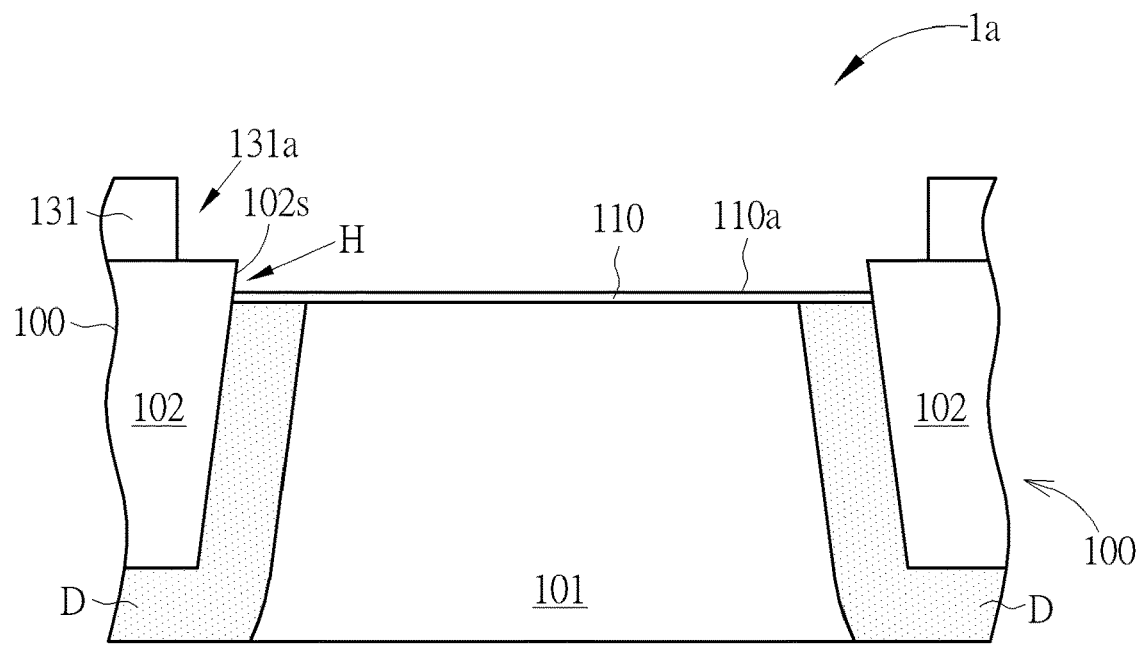

As shown in FIG. 9, the pad nitride layer 112 is removed by using methods known in the art, for example, a wet etching process or a dry etching process. After the removal of the pad nitride layer 112, the trench isolation region 102 protrudes from a top surface 110a of the pad oxide layer 110 and forms a step height H at an interface between the active area 101 and the trench isolation region 102. A first lithographic process is then performed to form a first patterned resist layer 131 such as a photoresist pattern on the substrate 100 by using methods known in the art, for example, a lithographic process including an exposure process and a development process. The first patterned resist layer 131 comprises a first opening 131a that exposes the active area 101 and partially exposes the trench isolation region 102 around the active area 101. According to an embodiment, the protruding portion of the trench isolation region 102 presents an oblique sidewall 102s.

Figure 10:
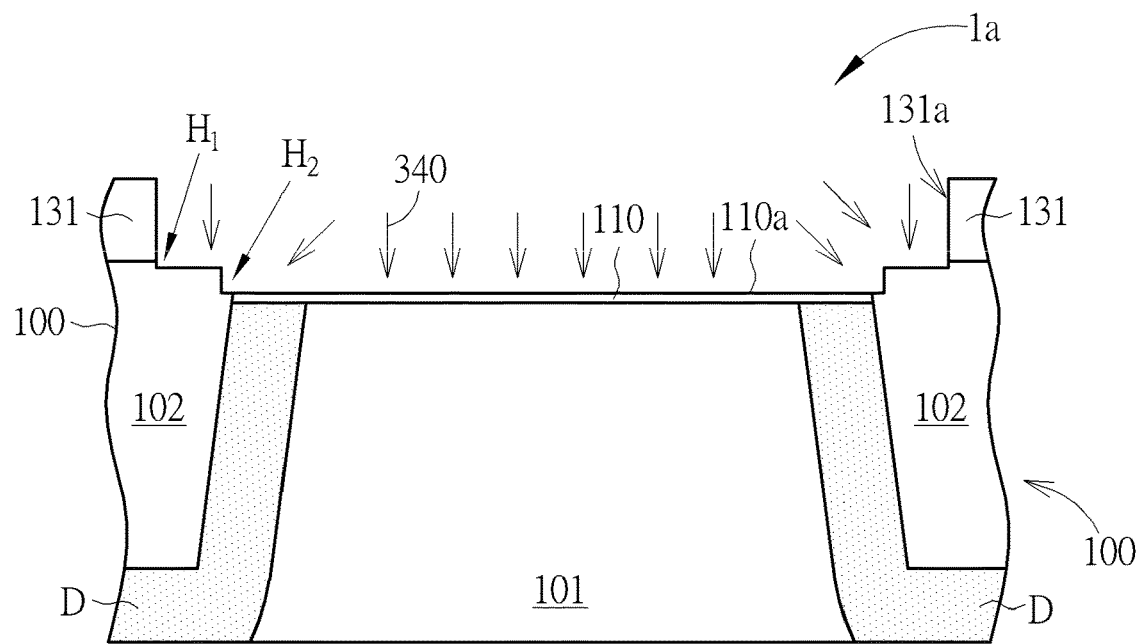

As shown in FIG. 10, a wet cleaning process 340 may be performed to remove a portion of the exposed trench isolation region 102 through the first opening 131a. According to an embodiment, the aforesaid wet cleaning process 340 may involve the use of diluted hydrofluoric acid (DHF) solution or the like, but is not limited thereto. According to an embodiment, the aforesaid wet cleaning process 340 may involve the use of a SPM (sulfuric acid and hydrogen peroxide mixture) clean process or a Caroz clean process, but not limited thereto. According to an embodiment, a portion of the pad oxide layer 110 may also be removed during the wet cleaning process 340. A first step height $H_1$ and a second step height $H_2$ are formed on the trench isolation region 102.

Figure 11:
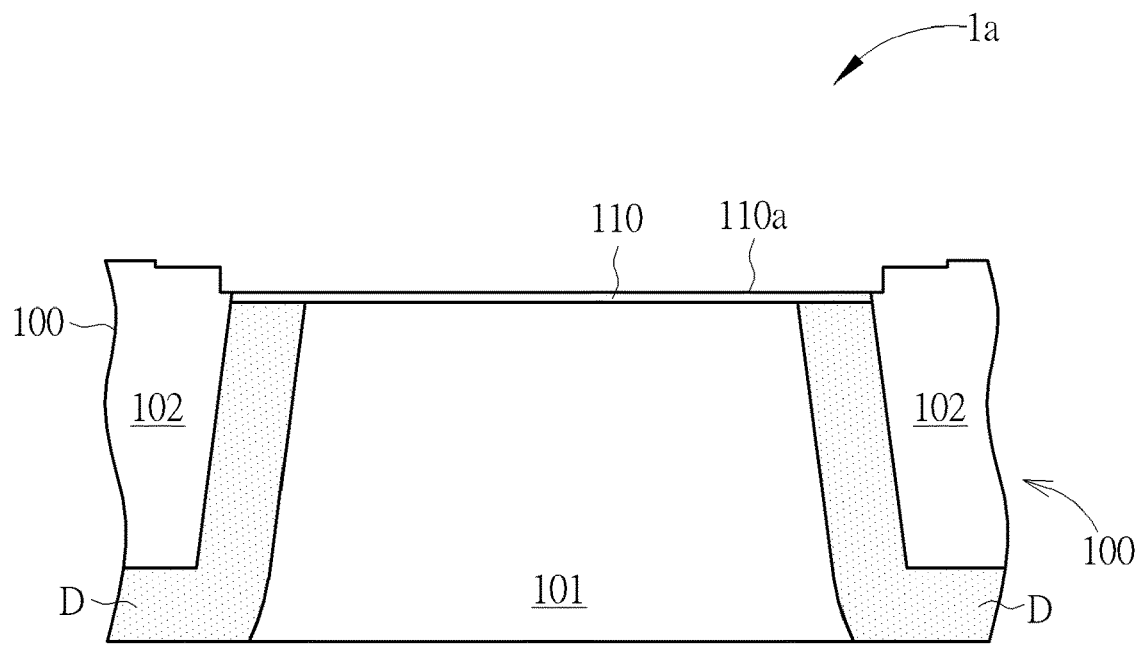

As shown in FIG. 11, after the wet cleaning process 340 is completed, the first patterned resist layer 131 is removed.

Figure 12:
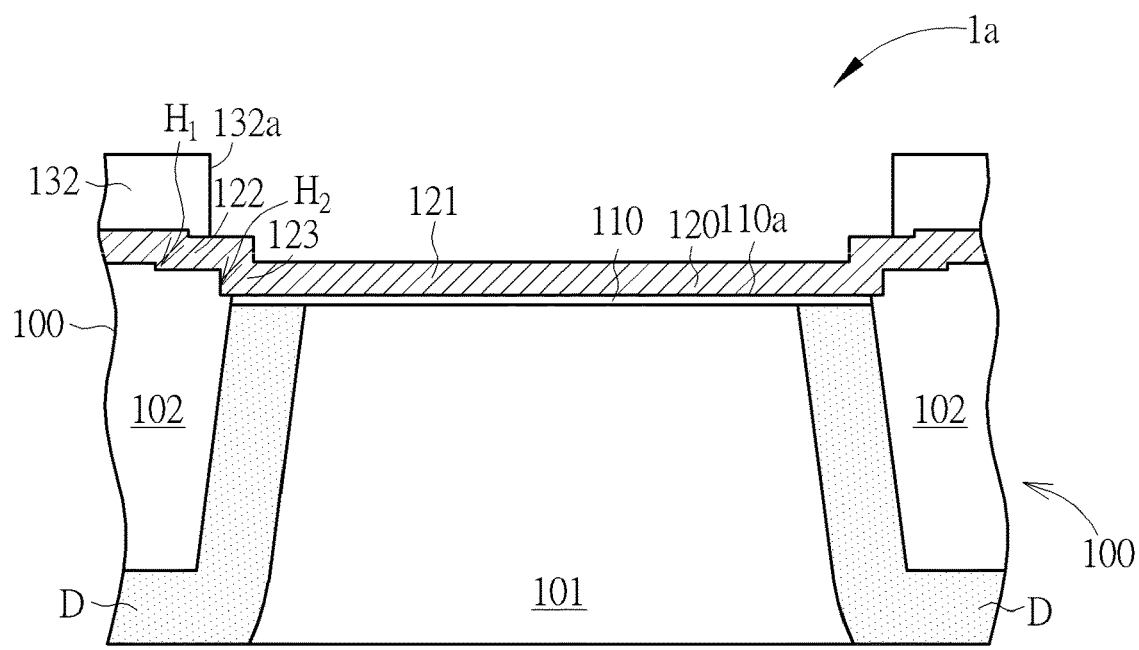

As shown in FIG. 12, a conformal hard mask layer 120 is then deposited on the substrate 100 in a blanket manner. According to an embodiment, the hard mask layer 120 may comprise a silicon nitride layer. According to an embodiment, the hard mask layer 120 may have a thickness of about 200 angstroms, but is not limited thereto. According to an embodiment, the hard mask layer 120 may comprise a first portion 121 directly on the active area 101, a second portion 122 directly on the trench isolation region 102, and a third portion 123 at the interface between the active area 101 and the trench isolation region 102. The third portion 123 extends between the first portion 121 and the second portion 122 and covers the second step height $H_2$ of the trench isolation region 102.

Subsequently, a second lithographic process is performed to form a second patterned resist layer 132 such as a photoresist pattern on the hard mask layer 120 by using methods known in the art, for example, a lithographic process including an exposure process and a development process. The second patterned resist layer 132 comprises a second opening 132a that exposes the first portion 121 on the active area 101 and the third portion 123 of the hard mask layer 120, and partially exposes the second portion 122 of the hard mask layer 120 on the trench isolation region 102.

Figure 13:
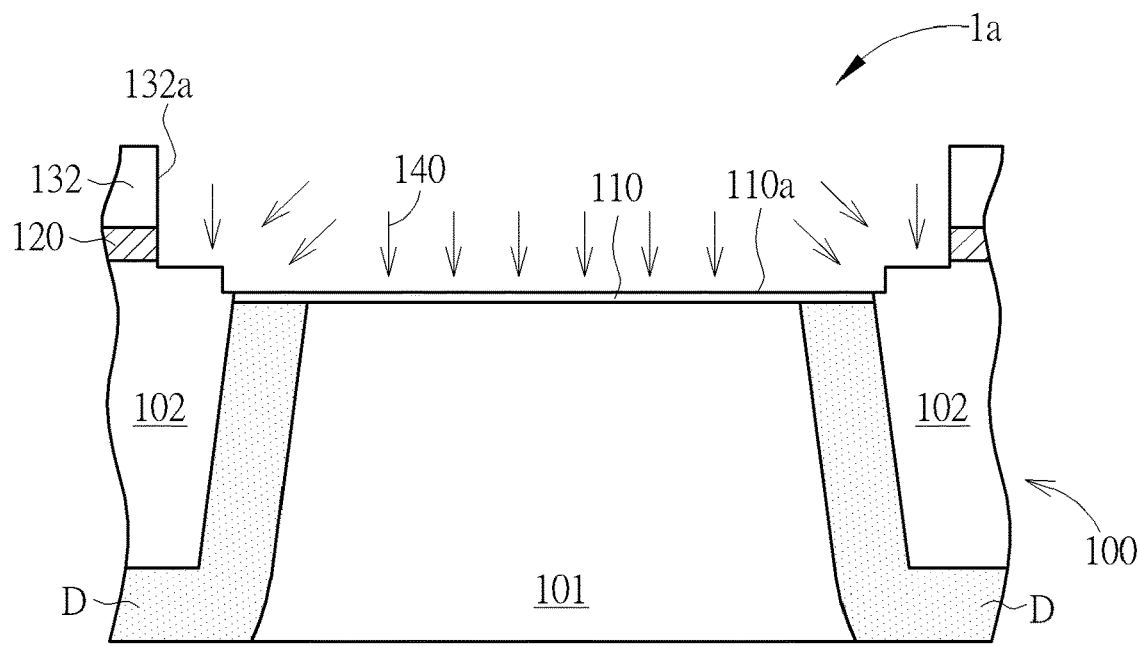

As shown in FIG. 13, an isotropic etching process (or SiN trimming process) 140 is then performed to selectively remove the exposed first portion 121, the second portion 122 and the third portion 123 of the hard mask layer 120 from the second opening 132a, thereby revealing the top surface 110a of the pad oxide layer 110. According to an embodiment, the first portion 121 of the hard mask layer 120 can be completely removed from the top surface 110a of the pad oxide layer 110. According to an embodiment, the third portion 123 of the hard mask layer 120 can be completely removed from the protruding portion of the trench isolation region 102.

Figure 14:
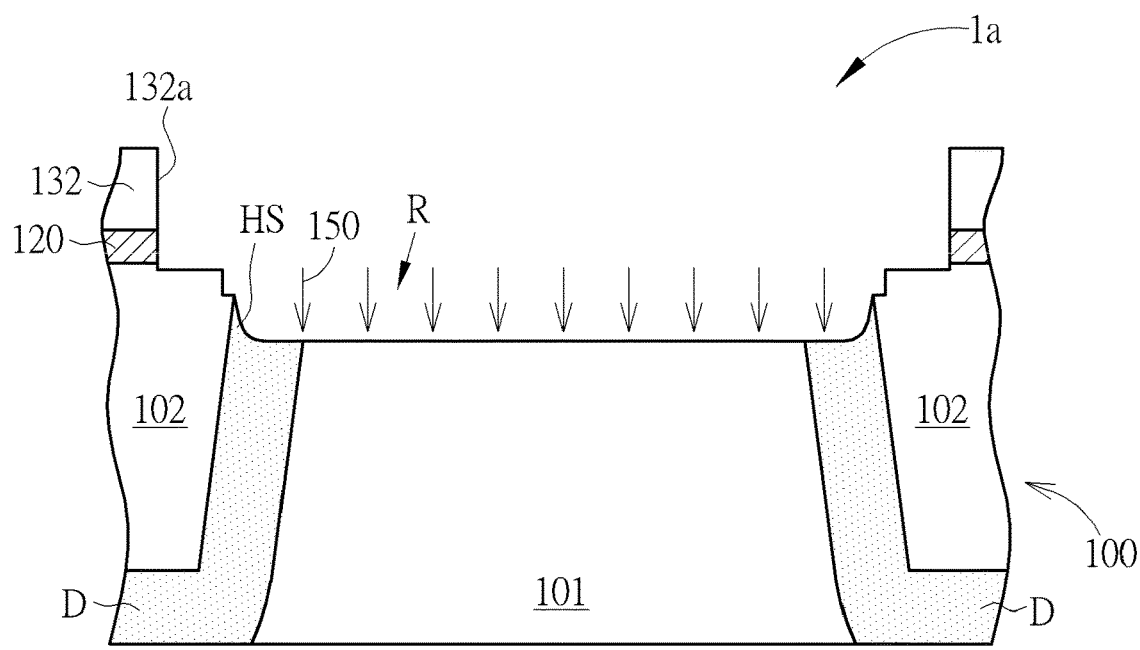

As shown in FIG. 14, an etching process 150 is then performed to anisotropically etch the active area 101 through the second opening 132a to form a recessed region R and a horn structure HS at the interface between the active area 101 and the trench isolation region 102. According to an embodiment, the recessed region R is a recessed silicon region and the horn structure HS is a silicon horn structure. During the etching process 150, the patterned resist layer 132 may be completely consumed and the underlying hard mask layer 120 may act as an etching hard mask. According to an embodiment, a portion of the trench isolation region 102 not covered by the hard mask layer 120 may be etched away. Optionally, after the etching process 150 is completed, a lateral etching process may be performed to laterally etch the horn structure HS, thereby forming a reduced horn structure.

Figure 15:
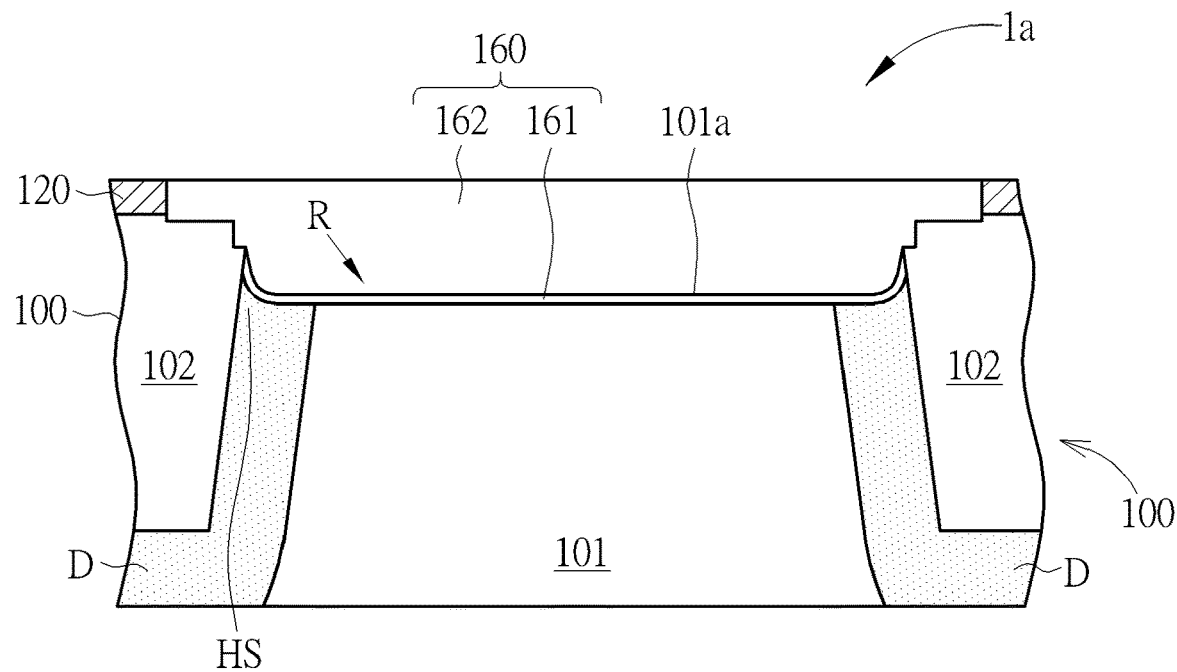

As shown in FIG. 15, a gate dielectric layer 160 is then formed in the recess R. According to an embodiment, for example, the gate dielectric layer 160 may comprises a first oxide layer 161 and a second oxide layer 162. According to an embodiment, for example, the first oxide layer 161 may be a silicon dioxide layer, which can be formed by using an oxidation process such as an in-situ steam generation (ISSG) process, but is not limited thereto. According to an embodiment, for example, the second oxide layer 162 may be a silicon dioxide layer, which can be formed by using a chemical vapor deposition (CVD) process, but is not limited thereto. According to an embodiment, the second oxide layer 162 may be deposited on the first oxide layer 161 and the hard mask layer 120 in a blanket manner, and then polished by using a chemical mechanical polishing (CMP) process using the hard mask layer 120 as a polish stop layer.

Figure 16:
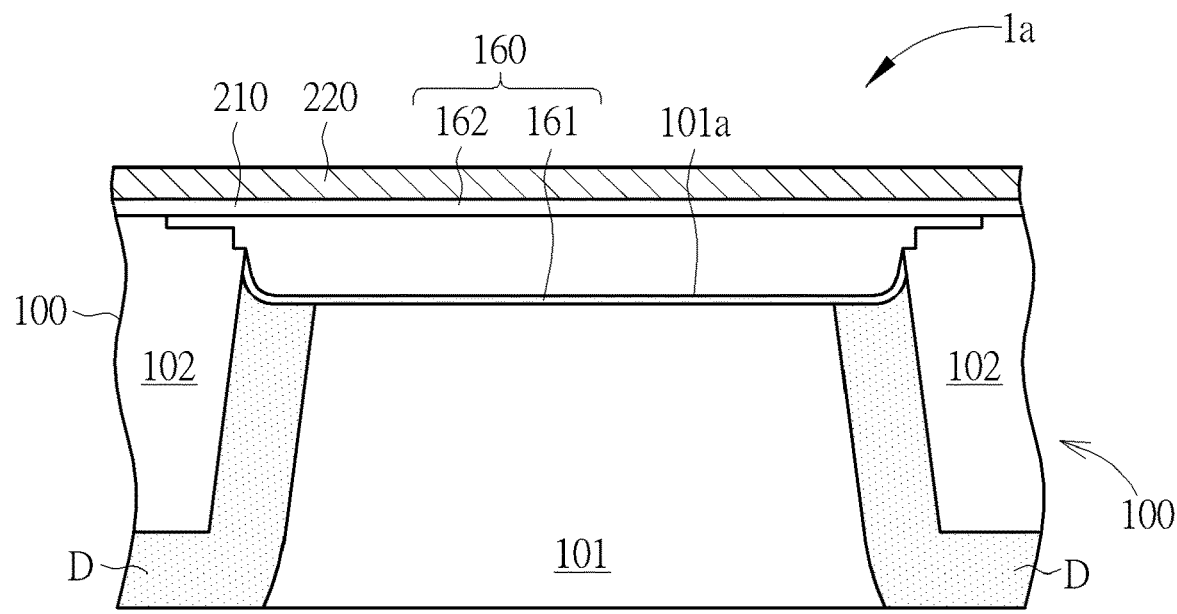

As shown in FIG. 16, after forming the gate dielectric layer 160 in the recess region R, the hard mask layer 120 may be removed. A high-k dielectric layer 210 is then deposited on the gate dielectric layer 160 and the trench isolation region 102. According to an embodiment, for example, the high-k dielectric layer 210 may comprise $HfO_2$, but is not limited thereto. Subsequently, a gate electrode layer 220 may be formed on the high-k dielectric layer 210. According to an embodiment, for example, the gate electrode layer 220 may comprise metals or polysilicon, but is not limited thereto.

It is advantageous to use the present invention because the horn structure can be effectively reduced and the negative-bias temperature instability (NBTI) of a HVMOS device arose from the abrupt horn structure can be alleviated or avoided, thereby improving the reliability of the HVMOS device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a substrate having an active area and a trench isolation region surrounding the active area, wherein the trench isolation region protrudes from a top surface of the active area and forms a step height at an interface between the active area and the trench isolation region;
   depositing a hard mask layer on the substrate, the hard mask layer comprising a first portion on the active area, a second portion on the trench isolation region, and a third portion at the interface between the active area and the trench isolation region, wherein the third portion extends between the first portion and the second portion;
   forming a patterned resist layer on the hard mask layer, wherein the patterned resist layer has an opening exposing the third portion and the first portion of the hard mask layer on the active area, and partially exposing the second portion of the hard mask layer on the trench isolation region;
   performing an isotropic etching process to remove the exposed first portion, the second portion and the third portion of the hard mask layer from the opening, thereby revealing the active area;
   anisotropically etching the active area through the opening to form a recessed region and a horn structure at the interface between the active area and the trench isolation region; and
   laterally etching the horn structure, thereby forming a reduced horn structure.

2. The method according to claim 1, wherein after laterally etching the horn structure, the method further comprising:
   performing an oxidation process to oxidize the reduced horn structure and a top surface of the substrate within the recessed region, thereby forming a first oxide layer; and
   depositing a second oxide layer on the first oxide layer.

3. The method according to claim 2, wherein the oxidation process is an in-situ steam growth (ISSG) process.

4. The method according to claim 2, wherein the first oxide layer is a silicon dioxide layer.

5. The method according to claim 2, wherein the second oxide layer is a silicon dioxide layer.

6. The method according to claim 2, wherein after depositing the second oxide layer on the first oxide layer, the method further comprising:
   removing the hard mask layer.

7. The method according to claim 1, wherein the substrate comprises a silicon substrate and the recessed region is a recessed silicon region.

8. The method according to claim 1, wherein the hard mask layer comprises a silicon nitride layer.

9. The method according to claim 1, wherein the horn structure is a silicon horn structure.

10. A method for fabricating a semiconductor device, comprising:
    providing a substrate having an active area and a trench isolation region surrounding the active area, wherein the trench isolation region protrudes from a top surface of the active area and forms a step height at an interface between the active area and the trench isolation region;
    performing a first lithographic process to form a first patterned resist layer on the substrate, wherein the first patterned resist layer has a first opening exposing the active area and partially exposing the trench isolation region;
    etching the exposed trench isolation region through the first opening;
    removing the first patterned resist layer;
    depositing a hard mask layer on the substrate, the hard mask layer comprising a first portion on the active area, a second portion on the trench isolation region, and a third portion at the interface between the active area and the trench isolation region, wherein the third portion extends between the first portion and the second portion;
    performing a second lithographic process to form a second patterned resist layer on the hard mask layer, wherein the second patterned resist layer has a second opening exposing the third portion and the first portion of the hard mask layer on the active area, and partially exposing the second portion of the hard mask layer on the trench isolation region; and
    performing an isotropic etching process to remove the exposed first portion, the second portion and the third portion of the hard mask layer from the second opening, thereby revealing the active area.

11. The method according to claim 10, wherein after performing the isotropic etching process to remove the exposed first portion, the second portion and the third portion of the hard mask layer from the second opening, the method further comprises:
  anisotropically etching the active area through the second opening to form a recessed region and a horn structure at the interface between the active area and the trench isolation region; and
  laterally etching the horn structure, thereby forming a reduced horn structure.

12. The method according to claim 11, wherein after removing the second patterned resist layer from the hard mask layer, the method further comprising:
  performing an oxidation process to oxidize the reduced horn structure and a top surface of the substrate within the recessed region, thereby forming a first oxide layer; and
  depositing a second oxide layer on the first oxide layer.

13. The method according to claim 12, wherein the oxidation process is an in-situ steam growth (ISSG) process.

14. The method according to claim 12, wherein the first oxide layer is a silicon dioxide layer.

15. The method according to claim 12, wherein the second oxide layer is a silicon dioxide layer.

16. The method according to claim 12, wherein after depositing the second oxide layer on the first oxide layer, the method further comprising:
  removing the hard mask layer.

17. The method according to claim 10, wherein the substrate comprises a silicon substrate and the recessed region is a recessed silicon region.

18. The method according to claim 10, wherein the hard mask layer comprises a silicon nitride layer.

19. The method according to claim 10, wherein the horn structure is a silicon horn structure.

* * * * *